United States Patent [19]
Chitre

[11] 4,081,820
[45] Mar. 28, 1978

[54] COMPLEMENTARY PHOTOVOLTAIC CELL

[75] Inventor: Sanjeev R. Chitre, Canoga Park, Calif.

[73] Assignee: Sensor Technology, Inc., Chatsworth, Calif.

[21] Appl. No.: 765,251

[22] Filed: Feb. 3, 1977

[51] Int. Cl.² ............................................. H01L 27/14
[52] U.S. Cl. ........................................ 357/30; 357/44; 357/46; 357/48; 250/211 J; 307/311
[58] Field of Search ...................... 357/30, 44, 46, 48; 250/211 J; 307/311

[56] References Cited
U.S. PATENT DOCUMENTS

| | | | |
|---|---|---|---|
| 3,319,174 | 5/1967 | Helstrom | 330/17 |
| 3,379,940 | 4/1968 | Nako | 317/235 |
| 3,414,783 | 12/1968 | Moore | 317/235 |
| 3,423,653 | 1/1969 | Chang | 317/235 |
| 3,484,663 | 12/1969 | Halms | 317/235 |
| 3,596,115 | 7/1971 | Conzelmann | 302/303 |
| 3,896,313 | 7/1975 | Berman | 250/372 |
| 3,994,012 | 11/1976 | Warner, Jr. | 357/30 |

Primary Examiner—Martin H. Edlow
Attorney, Agent, or Firm—Flam & Flam

[57] ABSTRACT

This complementary photovoltaic cell has both an N+/P+ junction and a P+/N junction on the same epitaxial substrate, and so provides simultaneous photoresponsive outputs of both negative and positive polarity. A vertical photo-junction supplements the current output from the N+/P+ junction, and improves the efficiency of the cell. The N+/P+ junction by itself exhibits a high open circuit voltage.

8 Claims, 3 Drawing Figures

COMPLEMENTARY PHOTOVOLTAIC CELL

BACKGROUND OF THE INVENTION

1. Field of the Invention

The present invention relates to a complementary photovoltaic cell that provides both positive and negative voltage sources on the same chip.

2. Description of the Prior Art

For certain applications, it is necessary to provide light-responsive signals of both positive and negative polarity. In the past, this has required the use of two separate devices fabricated on separate semiconductor chips. Physical assembly is difficult, particularly where both photosensors must be exposed to a beam of light of narrow cross-section. A principal object of the present invention is to provide a complementary photovoltaic cell that provides both positive and negative voltage outputs from a device fabricated on a single chip. The complementary junctions are very close to each other on the substrate, so that they can be activated by a narrow beam of light.

Another object of the present invention is to provide a complementary cell in which a higher open circuit voltage is obtained from one of the complementary junctions.

Another object of the present invention is to provide a complementary photovoltaic device in which both the positive and negative outputs can be used as current sources. This is important since in prior art complementary photo-responsive arrangements, the diode of one polarity often provided significantly more current output than the photovoltaic device providing the opposite polarity output. In the present invention, a third, vertical junction supplements the current output from the complementary diode which itself has lesser current output. Use of a vertical junction diode also improves the efficiency of the cell since it exhibits a higher response to light at the long wavelength (red) end of the spectrum.

Another object of the present invention is to provide a photoresponsive device having complementary outputs of opposite polarity in which all of the electrical contacts are accessible on a common surface of the device. This arrangement not only simplifies the connection to an external utilization means, but also permits serial or parallel interconnection of plural devices on the same chip by means of electrical conductors deposited onto the device surface in the final stages of fabrication. By merely changing the final metallurgy mask, any desired interconnection of the devices can be achieved.

SUMMARY OF THE INVENTION

These and other objectives are achieved by providing a complementary photovoltaic cell that is formed on a semiconductor substrate which may be an epitaxial layer. Alternate areas of P+ and N type conductivity are formed in the substrate. Each such area extends to the top surface of the substrate. A region of N+ conductivity extends from the top surface into each P+ area to form an N+/P+ photovoltaic junction which provides an output of negative polarity relative to the substrate. A region of P+ conductivity extends from the top surface into each of the N areas to form a P+/N junction that provides an output of positive polarity.

The lateral interface between adjacent areas of opposite conductivity itself forms a vertical P+/N photovoltaic junction that extends to the top surface. The current output from this vertical junction is additive to that of the N+/P+ junction, and so increases the current of the negative output. Device efficiency also is improved, since the vertical junction is more sensitive to the longer wavelength light components than are the other junctions of the device.

Electrodes from both the P+ and N conductivity areas and from the P+ and N+ regions all extend to the common top surface of the device. In this way, electrical connections to all of the diodes can be made from this common surface. Serial or parallel interconnections can be made by appropriate selection of the final metallurgy mask.

BRIEF DESCRIPTION OF THE DRAWINGS

A detailed description of the invention will be made with reference to the accompanying drawings wherein like numerals designate corresponding parts in the several figures.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention since the scope of the invention is best defined by the appended claims.

Figure 1:
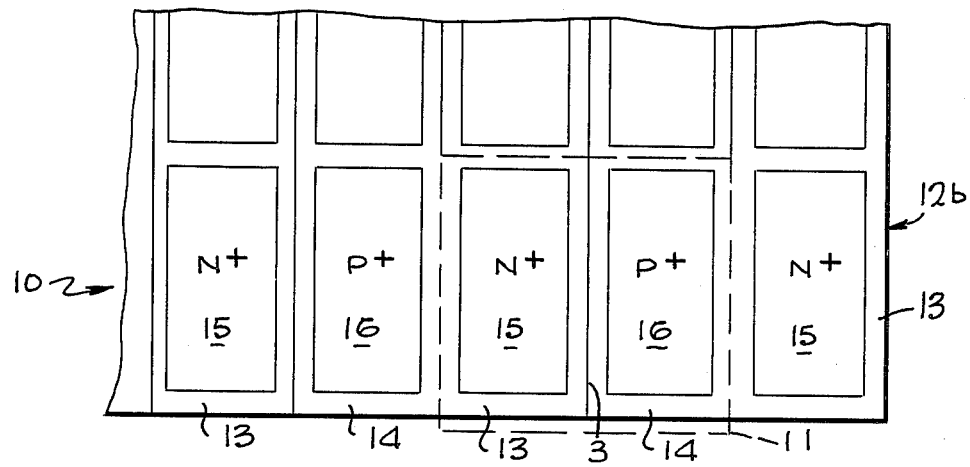
FIG. 1 is a top plan view of the inventive complementary photovoltaic device shown prior to formation of the electrodes.
Figure 2:
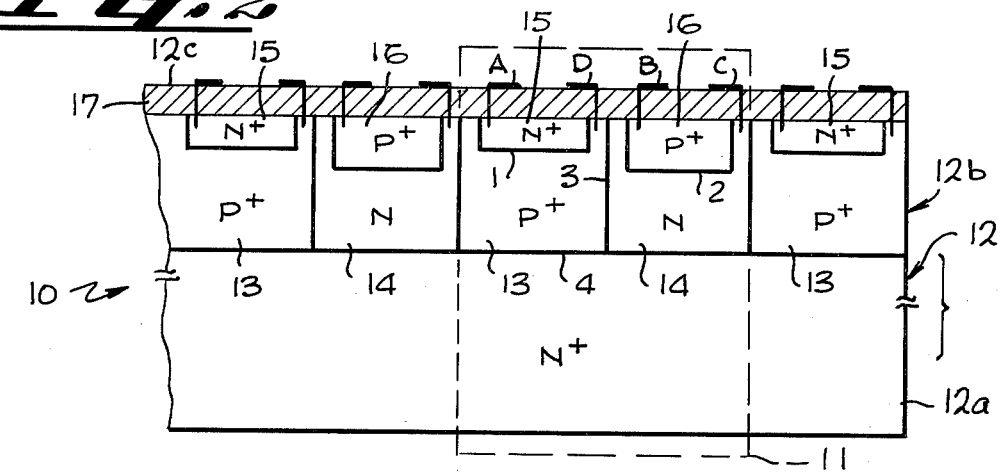
FIG. 2 is a greatly enlarged, transverse sectional view of the inventive device showing the individual complementary cells.

The device 10 shown in FIGS. 1 and 2 includes a plurality of complementary photovoltaic cells 11 formed on a common substrate 12. Each cell 11 includes an N+/P+ junction 1 that provides a positive output at a terminal A and a P+/N junction 2 that provides a negative output at a terminal output B. These two junction 1, 2 are shown as diodes in the schematic representation of FIG. 3.

The substrate 12 advantageously comprises an N+ semiconductor base 12a atop which is an epitaxial layer 21b. Formed within the layer 12b are alternate P+ and N type conductivity areas 13 and 14. The junctions 1 and 2 are formed by diffusion into the areas 13, 14 of appropriate dopants to form the N+ and P+ regions 15, 16. An oxide layer 17 overlies the substrate 12b. Electrodes A, B, C and D extend through the oxide layer 17 to the respective regions 15, 16 and areas 14, 13. All of the electrodes A-D thus are exposed on the planar upper surface 12c of the substrate 12.

The junctions 1 and 2 are complementary. When light impinges on the device surface 12c, a photovoltaic voltage is produced across both of the junctions 1 and 2. The open circuit voltage developed across the junction 1 is available for external utilization at the terminals A and D. Since this is a N+/P+ device, the open circuit voltage typically is on the order of about 0.45 volts to about 0.50 volts, and the terminal A is negative with respect to the terminal D. The output of the P+/N junction 2 appears across the contacts B and C, and has an open circuit voltage on the order of 0.30 to about 0.40 volts. The terminal B is positive with respect to the terminal C. Note that the open circuit voltage of the junction 1 is higher than that of the junction 2, and indeed is higher than that typical of N/P+ diodes. Thus, the junction 1 advantageously is used as a voltage source, while the junction 2 is a current source.

Figure 3:
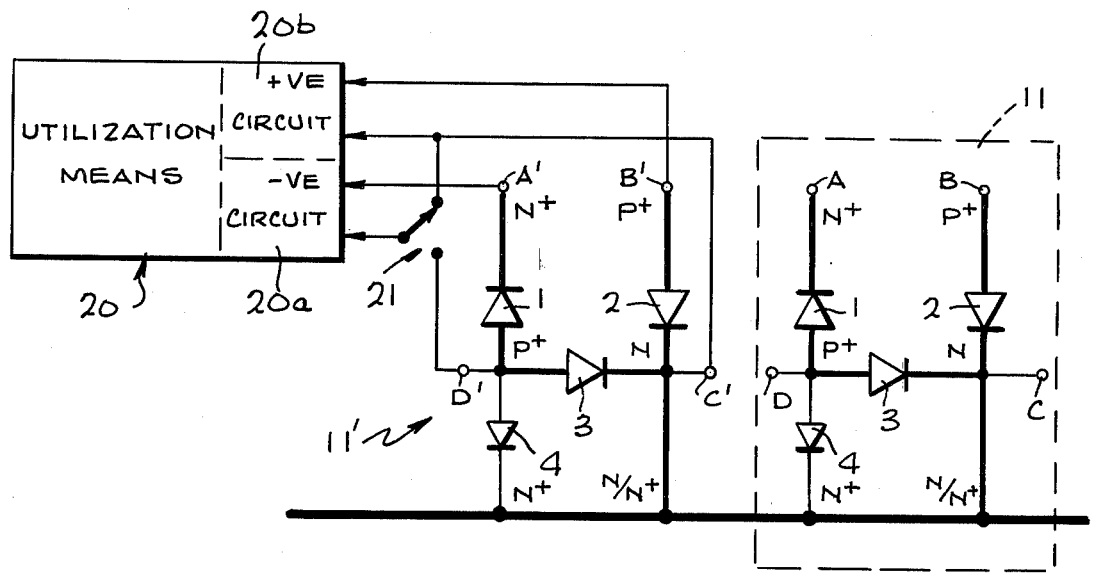
FIG. 3 is an equivalent electrical schematic diagram of the device of FIG. 2, showing typical interconnections with an external utilization means.

From FIG. 1 it can be seen that the lateral interface between the areas 13 and 14 forms a P+/N vertical junction 3 that extends to the top surface of the substrate 12b. As can be seen in FIG. 3, this photovoltaic junction 3 is in series with the junction 1 between the terminals A and C. The current generated in the junction 3 thus is added to and augments the current from the junction 1 when the negative output is taken between the terminals A and C. In this instance, the output voltage is reduced, since the junction 3 is poled opposite to that of the junction 1. Typically, the open circuit voltage across the junction 3 is on the order of 0.25 volts to 0.30 volts, so that the output voltage across the terminals A and C is on the order of about 0.25 volts, but with augmented current. The efficiency of the device 10 is improved by making use of the vertical junction 3. Since this junction extends to the upper face 12c, it is more sensitive to the longer wavelength components of the light striking the device 10 than is the diffused junction 1 or 2. Accordingly, a higher output efficiency is obtained when the vertical junction 3 is used.

As can be seen from FIG. 2, there is another junction 4 formed between the P+ region 13 and the N+ substrate layer 12a. As evident in FIG. 3, this junction 4 normally is reverse biased, and hence plays no role in the operation of the photovoltaic cell 11.

Each of the complementary cells 11 may be used with a utilization means 20 (FIG. 3) having a pair of circuits 20a, 20b, that require photo-responsive inputs of opposite polarity. The circuit 20b is provided with a positive input from the terminal B' of the cell 11', taken with reference to the common terminal C'. With a switch 21 in the position shown in FIG. 3, the other circuit 20a receives a negative input from the terminal A' also taken with reference to the terminal C'. As discussed above, with this configuration both the terminals A' and B' represent current sources of opposite polarity. Alternatively, the switch 21 may be set to the other position so that the circuit 20a receives its input from the terminals A' and D'. This input, supplied from the diode 1 alone, has the high open circuit voltage also discussed above.

Intending to claim all novel, useful and unobvious features, shown or described, the inventor claims:

1. A complementary photovoltaic cell comprising:
   a semiconductor substrate,
   alternate P+ and N type conductivity areas in said substrate, each such area extending to the top surface of said substrate,
   a region of N+ conductivity extending from said top surface into said P+ area to form an N+/P+ first photovoltaic junction, and
   a region of P+ conductivity extending from said top surface into said N area to form a P+/N second photovoltaic junction,
   said adjacent alternate areas forming a vertical P+/N third photovoltaic junction extending to said top surface,
   said first and second junctions being opposite polarity photovoltaic sources, said third junction being usable in series with said first junction to increase the photovoltaic current output thereof.

2. A complementary photovoltaic cell according to claim 1 further comprising electrodes extending from each of said P+ and N conductivity areas and said N+ and P+ regions to said top surface, said electrodes providing electrical connection from said top surface to each of said first, second and third photovoltaic junctions.

3. A photovoltaic device comprising a plurality of photovoltaic cells according to claim 2, all such cells being formed in the same substrate, said cells being interconncted by electrical connections made on the top surface of said device.

4. A photovoltaic device according to claim 2 together with utilization means requiring complementary photovoltaic outputs, said electrodes being connected to said utilization device to provide simultaneous photovoltaic outputs of positive and negative polarity.

5. A complementary photovoltaic cell according to claim 1 further comprising three electrodes extending respectively from said P+ and N+ conductivity regions and from said N type conductivity area to the top surface of said substrate, said cell thereby providing a photovoltaic output of positive polarity from said P+ region electrode and a simultaneous, separate photovoltaic output of negative polarity from said N+ region electrode, both with respect to said N type conductivity area electrode, said third junction adding to the current supplied by said first junction to said negative polarity output electrode.

6. A complementary photovoltaic device comprising:
   a semiconductor substrate,
   a plurality of first and second alternate areas of respective first and second opposite type conductivity formed in said substrate, each such area extending to a common surface of said substrate,
   each of said first areas having formed within it a region of conductivity opposite said first type to form a P+/N+ photovoltaic junction in each such first area,
   each of said second areas having formed within it a region of conductivity type opposite said second type to form a photovoltaic junction providing an output of polarity opposite that of said P+/N+ junction,
   the lateral interface between adjacent alternate areas of opposite conductivity forming a vertical photovoltaic junction usable to provide a current source in series with the junction of one of said first or second areas.

7. A complementary photovoltaic device according to claim 6 wherein said substrate comprises an epitaxial semiconductor layer atop a semiconductor base, said base being N+ conductivity, said first and second alternate areas being respectively P+ and N conductivity, said regions being respectively N+ and P+ conductivity, said vertical junction being usable in series with the respective P+/N+ junction to add to the photovoltaic current output thereof.

8. A complementary photovoltaic device according to claim 7 together with utilization means requiring simultaneous photo-responsive outputs of opposite polarity, said device having a first electrode providing contact to said N conductivity area and serving as a common connection for both opposite polarity outputs, said device having respective second and third electrodes respectively providing contact to said N+ and P+ regions and serving respectively as the output connections of negative and positive polarity, said first, second and third electrodes being connected to said utilization device, the photovoltaic current provided to said second electrode being the sum of that produced by the P+/N+ junction with which said second electrode is associated and the adjacent vertical photovoltaic junction.

* * * * *